US007965084B2

(12) United States Patent
Martens et al.

(10) Patent No.: US 7,965,084 B2
(45) Date of Patent: Jun. 21, 2011

(54) SELF-MONITORING SWITCH

(75) Inventors: Rodney Ivan Martens, Danville, CA (US); Jun Jason Yao, San Ramon, CA (US)

(73) Assignee: FormFactor, Inc., Livermore, CA (US)

( * ) Notice: Subject to any disclaimer, the term of this patent is extended or adjusted under 35 U.S.C. 154(b) by 498 days.

(21) Appl. No.: 12/106,372

(22) Filed: Apr. 21, 2008

(65) Prior Publication Data

US 2009/0260962 A1 Oct. 22, 2009

(51) Int. Cl.
*G01R 31/327* (2006.01)

(52) U.S. Cl. ....................................................... 324/415

(58) Field of Classification Search .................. 324/415
See application file for complete search history.

(56) References Cited

U.S. PATENT DOCUMENTS

| | | | | |
|---|---|---|---|---|
| 5,667,397 | A * | 9/1997 | Broschard et al. | 439/188 |
| 6,231,227 | B1 * | 5/2001 | Andersen | 374/4 |
| 7,106,066 | B2 | 9/2006 | Ivanciw et al. | |
| 7,190,092 | B2 | 3/2007 | Ivanciw et al. | |
| 2004/0257086 | A1 * | 12/2004 | Montrose et al. | 324/420 |

* cited by examiner

*Primary Examiner* — Amy He
(74) *Attorney, Agent, or Firm* — Kirton & McConkie

(57) ABSTRACT

Methods and apparatus for switching electrical signals are provided herein. In some embodiments a smart switch is provided, the smart switch may include a switch having a wipe capability; a monitor coupled to the switch for monitoring a performance characteristic thereof; and a controller configured to provide a stepped change in wipe applied by the switch between closing cycles thereof in response to the monitored performance characteristic. In some embodiments, an electronic device may be provided having a smart switch disposed therein.

22 Claims, 4 Drawing Sheets

SELF-MONITORING SWITCH

BACKGROUND OF THE INVENTION

1. Field of the Invention

The present invention generally relates to improving electrical switches.

2. Description of the Related Art

Electrical switches are commonly used in many devices, such as, microelectromechanical systems (MEMS). In the MEMS example, such devices often utilize switches to selectively make contacts to route electrical signals through the MEMS devices to facilitate the use and control thereof. Such switches are typically expected to have a fixed lifetime, such that any problem that interferes with the operation or performance of the switch typically effectively destroys the MEMS device. For example, oxidation on contacts of the switch may degrade the electrical performance of the switch. Similarly, contact pad wear due to use of the switch may also decrease the performance and/or the life of the switch. Further, particles or other contaminants may also interfere with switch performance.

U.S. Pat. No. 7,106,066, issued to Ivanciw, et al. (hereinafter Ivanciw), discloses a circuit that may be coupled to a switch for sensing a performance parameter of the switch and providing a time-varying action if the sensed performance parameter is outside of some threshold value, such as applying a time-varying voltage to the control element of a closed switch to cause a motion of an end of a beam of the switch against a corresponding contact pad.

The motion disclosed by Ivanciw is taught to include a back-and-forth (lateral) movement of the beam along a plane parallel to and in contact with the contact pad (e.g., a rubbing motion), or an up-and-down movement of at least a portion of the beam perpendicular to the contact pad, such that the beam taps the contact pad. The time-varying voltage of Ivanciw can increase the lateral displacement (or movement) of the beam and the amount of the beam that contacts the contact pad. For example, Ivanciw teaches that a greater voltage will increase the lateral movement and the degree by which the beam contacts with, and thereby rubs, the contact pad.

The switches disclosed by Ivanciw generally provide plate-to-plate contact between the switch element and the contact pad (where relatively large contact areas engage in a predominantly perpendicular manner) or an active-opening "teeter-totter" switch (where an electrode is placed on either side of a pivot point for controlling the position of a beam of the switch). In the plate-to-plate switch examples, however, any rub that is generated is relatively small due to the configuration of the switch, thereby limiting any effect provided by the circuit controlling the switch. Moreover, the relatively large contact areas continues to promote the stiction problem. In the "teeter-totter" switch configuration, any rub of the contact element is again limited due to the linear configuration of the beam of the switch.

In addition, the switches disclosed by Ivanciw rely on electrostatic attraction between the beam/plate of the switch and an electrode disposed thereunder to pull the beam/plate into a closed position. Such switch closing electrode configurations undesirably utilize relatively high voltages, thereby limiting their application in devices where much lower voltages are required. For example, Ivanciw discloses switches having closing voltages of greater than 40 Volts, and operational voltages of up to almost 70 volts.

Thus, there is a need for an improved switch.

SUMMARY OF THE INVENTION

Methods and apparatus for switching electrical signals are provided herein. In some embodiments a smart switch is provided, the smart switch may include a switch having a wipe capability; a monitor coupled to the switch for monitoring a performance characteristic thereof; and a controller configured to provide a stepped change in wipe applied by the switch between closing cycles thereof in response to the monitored performance characteristic.

In some embodiments, an electronic device may be provided. In some embodiments, an electronic device may include an input circuit for at least one of receiving or producing a signal; an output circuit for receiving the signal from the input circuit; and a smart switch for selectively coupling the input circuit to the output circuit, the smart switch including a switch having a wipe capability; a monitor coupled to the switch for monitoring a performance characteristic thereof; and a controller configured to provide a stepped change in wipe applied by the switch between closing cycles thereof in response to the monitored performance characteristic.

In some embodiments, a method of switching a signal in a microelectronic device is provided. In some embodiments, a method of switching a signal in a microelectronic device may include monitoring one or more characteristics of operation of a switch; comparing the monitored characteristics to a metric; and changing a quantity of wipe applied by the switch in response to the comparison.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate elements that are common to the figures. The images used in the drawings are simplified for illustrative purposes and are not necessarily depicted to scale.

DETAILED DESCRIPTION

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The present invention provides a smart electrical switch capable of monitoring its own health (e.g., characteristics of performance of the switch) and of controlling its operation in response to the health monitoring function. The smart switch advantageously may increase performance and lifetime of the switch, thereby providing a switch having a longer life and higher reliability. In some embodiments, a microelectromechanical system (MEMS) may include a smart switch. In some embodiments, an electronic device may include a smart switch.

Figure 1:
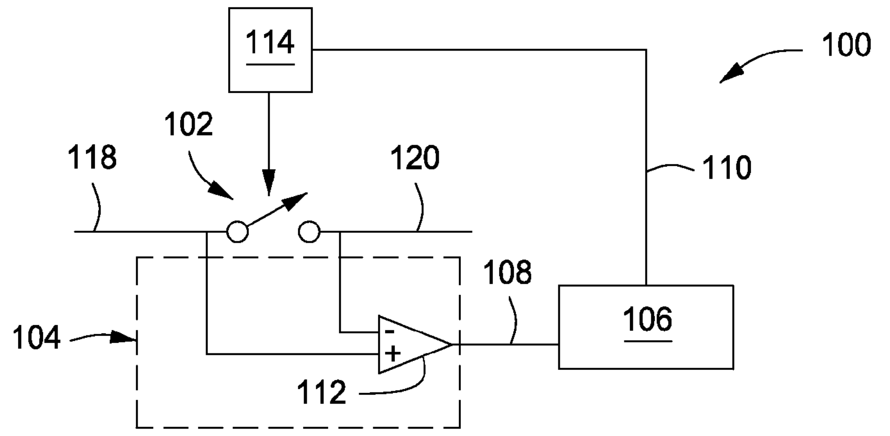
FIG. 1 depicts a schematic diagram of a smart switch in accordance with some embodiments of the present invention.

FIG. 1 depicts a smart switch 100 in accordance with some embodiments of the invention. The smart switch 100 generally includes a switch 102, a monitor 104 for monitoring one or more performance characteristics of the switch, and a controller 106 for controlling the operation of the switch 102 in response to a signal provided by the monitor 104.

The switch 102 may generally comprise any suitable switch for selectively opening and closing an electrical pathway (such as conductors 118 and 120 depicted in FIG. 1). For example, the switch 102 may selectively come into contact with contact pads, or terminals (not shown) of one or more of conductors 118 and 120 to open or close the switch 102. An actuator 114 may be coupled to the switch 102 for controlling the position thereof with respect to the conductors 118 and 120.

Various actuators may be utilized to control the operation of the switch. In some embodiments, the switch may include an actuator coupled to a resilient contact element (described in more detail below) to provide the motion of the switch (e.g., to provide a force that controls the position of the resilient contact element of the smart switch).

Examples of suitable actuators may be electrically, mechanically, or electromechanically driven and may vary in size to suit the application. In some embodiments, the actuator may be a micro-electromechanical system (MEMS) device, such as an electrostatic gap closing actuator, a comb drive, combinations thereof, or the like. Non-limiting examples of suitable MEMS actuators, such as electrostatic gap closing actuators, comb drives, angled gap closing actuators, partitioned MEMS actuators, or multistage MEMS actuators, may be found in U.S. patent application Ser. No. 12/106,364, filed Apr. 21, 2008 and entitled, "Switch for use in Microelectromechanical Systems (MEMS) and MEMS Devices Incorporating Same," which is hereby incorporated by reference in its entirety. The use of MEMS actuators may facilitate developing large actuations forces (on the order of milliNewtons) and fast switching times (such as less than about 10 msec). The use of MEMS actuators may facilitate the use of low actuation voltages such as, in some embodiments, less than 3 Volts. Such low voltage actuation may facilitate the use of the smart switch in, for example, cell phone or other consumer electronic applications.

Examples of contact elements suitable for use in connection with the smart switch are described below. Additional examples of contact elements suitable for use in connection with the smart switch may also be found in the above referenced U.S. patent application Ser. No. 12/106,364 as well as in U.S. patent application Ser. No. 12/106,369, filed herewith and entitled, "Multi-Stage Spring System," which is hereby incorporated by reference in its entirety. The contact elements, or contact portions thereof, may be fabricated from materials and configured to carry relatively large currents, such as greater than 0.5 Amps at 125 degrees Celsius. In some embodiments, the contact elements, or the contact portions thereof, may be fabricated from relatively hard materials, such as noble metals and semi-noble metals, such as palladium, gold, rhodium, and combinations or alloys thereof, and the like, that may facilitate providing longer life and higher reliability as compared to conventional MEMS switches. For example, in some embodiments, switching cycles may exceed billions of cycles, while maintaining a low contact resistance.

In some embodiments, the switch 102 may comprise a wipe-capable contact element. As used herein, the term "wipe capable" means that the switch 102 is configured to be able to wipe the contact pad upon closing the switch. Such wipe may be provided selectively (e.g., the switch may be capable of closing with or without providing wipe) or each time the switch is closed. In addition, the magnitude of any wipe provided may be controlled such that the distance that the tip moves with respect to the contact pads after initial contact may be controlled as desired. In some embodiments, the amount of wipe utilized when closing the switch may be selectively controlled over time (e.g., over repeated close cycles of the switch) in order to continuously provide a "fresh" (e.g., unworn and/or uncorroded, or acceptably worn and/or corroded) contact point on the surface of the contact pad. The term "wipe" may be defined as lateral movement of the contact element of the switch across the contact pad after initial contact with the contact pad (e.g., the contact element of the switch initially contacts the contact pad at a first point, then wipes the surface of the contact pad as it moves to a second point). Thus, the term "wipe" includes any post-contact motion between contact elements and contact pads such that physical, frictional relative motion therebetween is developed. As used herein, the term "contact" includes any initial contact sufficient to establish electrical connection between contact elements and contact pads and any additional motion of either or both of contact elements and contact pads sufficient to induce wipe therebetween.

Figure 2A:
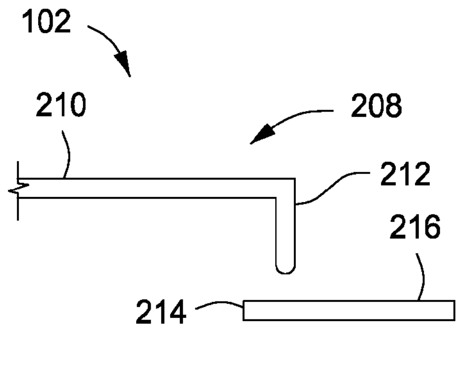
FIGS. 2A-B respectively depict schematic views of non-limiting exemplary switches suitable for use in a smart switch in accordance with some embodiments of the present invention.
Figure 2B:
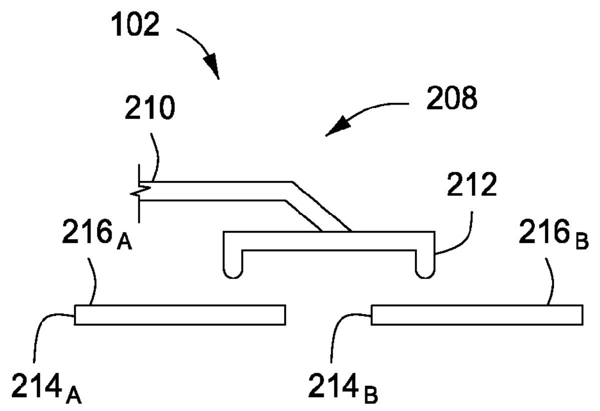

For example, FIGS. 2A-B respectively depict schematic views of switches suitable for use in a smart switch in accordance with some embodiments of the present invention. In some embodiments, and as depicted in FIG. 2A, the switch 102 may include a resilient contact element 208 having a cantilevered beam 210 and a tip 212 configured for selectively contacting an upper surface 216 of a contact pad 214. The beam 210 and tip 212 may be configured to be capable of providing a controllable wipe, when desired, across the upper surface 216 of the contact pad 214 upon application of a closing force to the switch 102 beyond that necessary to make initial contact with the contact pad 214. The maximum amount of wipe possible for a given switch 102 may be defined by the configuration of the resilient contact element 208 (e.g., by the configuration of the beam 210 and tip 212).

In some embodiments, as shown in FIG. 2A, the beam 210 of the switch 102 may be part of the conductive pathway (e.g., the switch 102 selectively contacts contact pad 214 at one end and may be coupled to a second terminal, not shown, through the beam 210.) In some embodiments, as shown in FIG. 2B, the conductive pathway may flow through the tip 212 between two terminals, or contact pads $\mathbf{214}_A$ and $\mathbf{214}_B$ (without flowing through the beam 210). The switch 102 may be configured to be capable of providing a controllable wipe, when desired, across respective upper surfaces $\mathbf{216}_A$, $\mathbf{216}_B$ of the contact pads $\mathbf{214}_A$, $\mathbf{214}_B$.

Figure 3A:
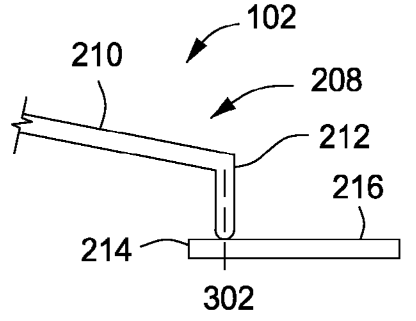
FIGS. 3A-B respectively depict schematic views of a smart switch during various stages of operation in accordance with some embodiments of the present invention.
Figure 3B:
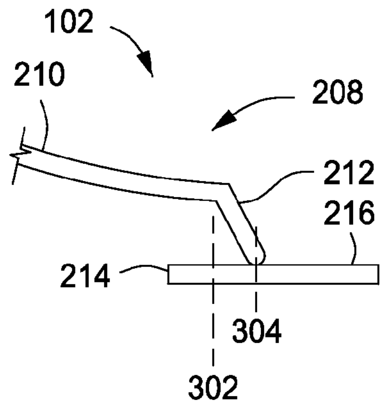

For example, FIGS. 3A-B respectively depict schematic views of illustrative stages of operation of a smart switch similar to that described in FIG. 2A in accordance with some embodiments of the present invention. Elements in FIGS. 3A-B that are identical to those shown in FIGS. 1 and 2A-B have identical reference numerals and may be understood by reference to the descriptions provided above. In operation, the switch 102 may begin in an open position, where the resilient contact element 208 is not in contact with the contact pad 214 (as shown in FIG. 2A). Upon closing the switch 102, the tip 212 of the resilient contact element 208 may initially come into contact with the upper surface 216 of the contact pad 214 at an initial location (represented by line 302). In some embodiments, the tip 212 may remain at the initial location while the switch remains closed and may return to the state shown in FIG. 2A when the switch is opened. In some embodiments, and as shown in FIG. 3B, the switch 102 may provide a wipe across the upper surface 216 of the contact pad 214. For example, the switch 102 may be controlled to cause the tip 212 of the resilient contact element 208 to move across the upper surface 216 of the contact pad 214 from the initial location (e.g., 302) to a final location (represented by line 304) different from the initial location. In some embodiments, the final location of the tip 212 may be controlled as desired, for example via control of an actuation force applied to the switch 102 (e.g., the final location of the tip 212 may be selectively controlled to be at any point between the initial contact location and a location disposed away from the initial contact location by a maximum wipe distance). For example, increasing an actuation force can be used to increase wipe.

Figure 4B:
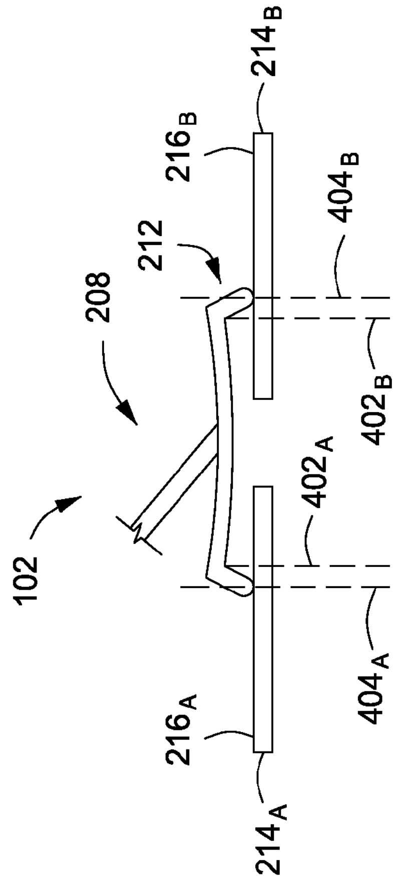
FIGS. 4A-B respectively depict schematic views of a smart switch during various stages of operation in accordance with some embodiments of the present invention.
Figure 4A:
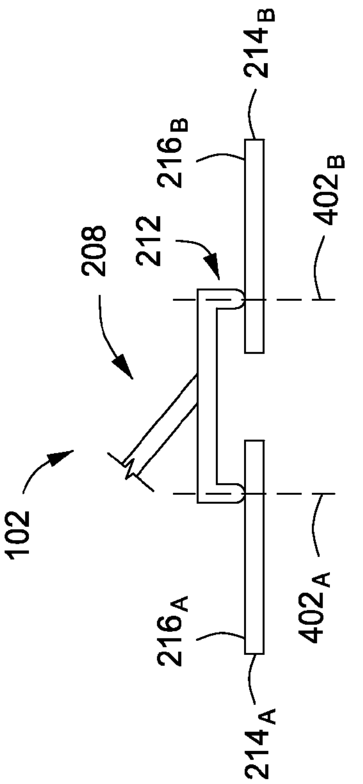

FIGS. 4A-B respectively depict schematic views of illustrative stages of operation of a smart switch similar to that described in FIG. 2B in accordance with some embodiments of the present invention. Elements in FIGS. 4A-B that are identical to those shown in FIGS. 1 and 2A-B have identical reference numerals and may be understood by reference to the descriptions provided above. In operation, the switch 102 may begin in an open position, where the resilient contact element 208 is not in contact with the contact pads $\mathbf{214}_{A\text{-}B}$ (as shown in FIG. 2B). Upon closing the switch 102, the tip 212 of the resilient contact element 208 may initially come into contact with the respective upper surfaces $\mathbf{216}_{A\text{-}B}$ of the contact pads $\mathbf{214}_{A\text{-}B}$ at an initial location (represented by lines $\mathbf{402}_{A\text{-}B}$, respectively). In some embodiments, the tip 212 may remain at the initial locations on the contact pads $\mathbf{214}_{A\text{-}B}$ while the switch remains closed and may return to the state shown in FIG. 2B when the switch is opened. In some embodiments, and as shown in FIG. 4B, the switch 102 may provide a wipe across the upper surfaces $\mathbf{216}_{A\text{-}B}$ of the contact pads $\mathbf{214}_{A\text{-}B}$. For example, the switch 102 may be controlled to cause the tip 212 of the resilient contact element 208 to move across the upper surfaces $\mathbf{216}_{A\text{-}B}$ of the contact pads $\mathbf{214}_{A\text{-}B}$ from the initial locations (e.g., $\mathbf{402}_{A\text{-}B}$) to a final location (represented by line $\mathbf{404}_{A\text{-}B}$, respectively) different from the initial location. In some embodiments, the final locations of the tip 212 on the contact pads $\mathbf{214}_{A\text{-}B}$ may be controlled as desired, as discussed above with respect to FIGS. 3A-B. In some embodiments, the tip 212 may be flexible, or may be coupled to a flexible member to facilitate providing the dual wiping motion as depicted in FIG. 4B.

In some embodiments, a resilient contact element may be provided having a tip configured to provide a varying contact point with respect to upper surfaces of any contact pad or contact pads that the tip selectively contacts. Such a tip may advantageously provide a fresh (e.g., unworn and/or uncorroded, or acceptably worn and/or corroded) contact point on the tip for contacting the surface of the contact pad. In some embodiments, the varying contact point of the tip may be provided in conjunction with a wiping action of the tip (as discussed above with respect to FIGS. 3A-B and 4A-B), which may provide fresh contact surfaces for both of the tip and the contact pads over a range of contact positions between the tip and the contact pads.

Figure 5C:
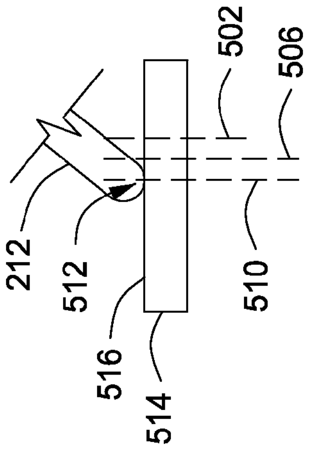
FIGS. 5A-C respectively depict schematic views illustrating a wiping motion of a tip of a resilient contact element in accordance with some embodiments of the present invention.
Figure 5B:
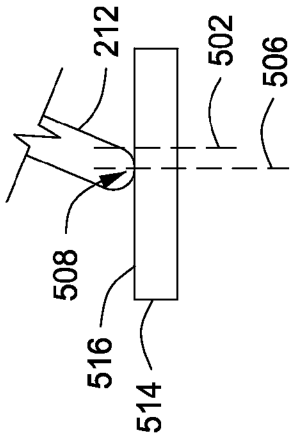
Figure 5A:
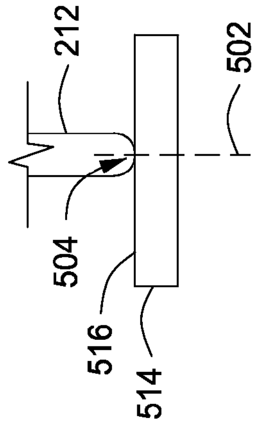

For example, in some embodiments, and as shown in FIGS. 5A-C, a tip 212 (similar to the tips described above with respect to FIGS. 2A-B) may be provided having a rounded end for contacting an upper surface 516 of a contact pad 514. Although FIGS. 5A-C shows only one tip 212, other tip configurations, such as that shown in FIGS. 2B and 4A-B, may be similarly configured and operated. The rounded end of the tip 212 may have any suitable profile, such as spherical, spheroidal, ovoid, or the like and may or may not be symmetrically formed and/or disposed at the end of the tip 212. The profile of the rounded end of the tip 212 may facilitate rotating the end of the tip 212 with respect to the upper surface 516 of the contact pad 514. By rotating the end of the tip 212, varying contact points between the tip 212 and the upper surface 516 of the contact pad 514 may be controllably provided.

For example, in some embodiments, as shown in FIG. 5A, the rounded profile of the end of the tip 212 may facilitate contacting a first location 502 of the upper surface 516 of the contact pad 514 at a first portion 504 of the rounded end of the tip 212 (for example, when initially contacting the upper surface 516 of the contact pad 514).

As shown in FIG. 5B, when a first quantity of wipe is applied (e.g., upon providing a controlled wipe that may cause the tip 212 to wipe the contact pad 514 a first distance), the rounded profile of the end of the tip 212 may facilitate contacting a second location 506 of the upper surface 516 of the contact pad 514 at a second portion 508 of the rounded end of the tip 212 (e.g., the rounded end of the tip 212 may move across the upper surface 516 of the contact pad 514 and may rotate to present a different contact point with respect to the upper surface 516).

As shown in FIG. 5C, when a second, different quantity of wipe is applied (e.g., upon providing a controlled wipe that may cause the tip 212 to wipe the contact pad 514 a second distance), the rounded profile of the end of the tip 212 may facilitate contacting a third location 510 of the upper surface 516 of the contact pad 514 at a third portion 512 of the rounded end of the tip 212.

Accordingly, varying quantities of wipe may be controllably provided, for example, by control over an actuation force applied to the switch, that may advantageously facilitate control over the location of the contact pad where the tip of the switch may be disposed when in a closed position and/or control over the portion of the tip that may come into contact with the contact pad when the switch is in a closed position.

In some embodiments, the resilient contact element of the switch may be configured to maintain alignment and/or contact with the contact pads over a range of contact locations. For example, a mechanism may be provided to facilitate rotation, or pivoting, of the tip while maintaining relatively even contact pressure between the tip and the contact pads. Examples of suitable mechanisms include hinges, flexures, springs, or the like. The mechanism may be provided at any suitable location in the resilient contact element or in the contact pads (or underlying members upon which the contact pads may be disposed).

Figure 6:
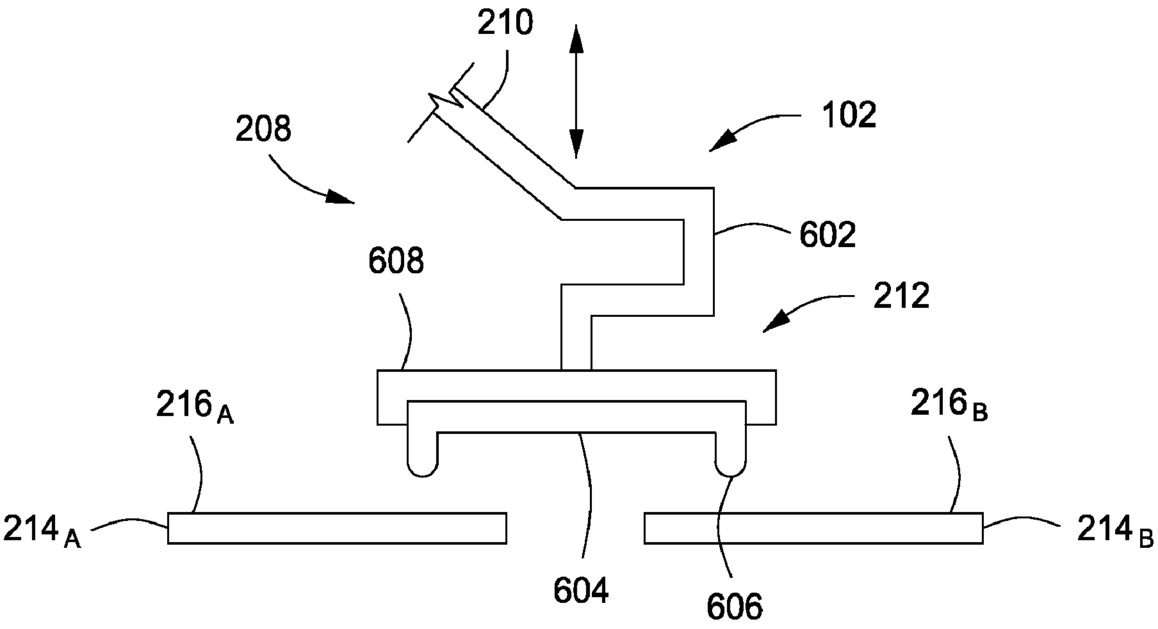
FIG. 6 depicts a schematic side view of a tip of a resilient contact element having a configuration in accordance with some embodiments of the present invention and suitable for use in a smart switch in accordance with some embodiments of the present invention.

For example, FIG. 6 depicts a schematic side view of a tip 212 of a resilient contact element 102 having a configuration in accordance with some embodiments of the present invention and suitable for use in a smart switch in accordance with some embodiments of the present invention. As shown in FIG. 6, the beam 210 of the resilient contact element 208 may include a spring 602 that may facilitate rotation of the tip 212 and maintain more even contact pressure between the tip 212 and the respective upper surfaces $\mathbf{216}_{A\text{-}B}$ of the contact pads $\mathbf{214}_{A\text{-}B}$ when the switch 102 is in a closed position (at various levels of force applied and/or resultant wipe provided).

FIG. 6 further depicts a tip configuration in accordance with some embodiments of the invention where the tip 212 may include a base 608 and a contact 604. The contact 604 may be at least partially fabricated from any conductive material or materials suitable for conducting an electrical signal therethrough and may include protrusions 606 for contacting the contact pads $\mathbf{214}_{A\text{-}B}$. The protrusions 606 may be configured similarly to the rounded ends of the tips 212, as discussed above. The base 608 (and the remainder of the resilient contact element 208) may be fabricated from any suitable material or materials for providing a desired resilience of the contact element, including non-conductive materials (as the electrical signal may be primarily or solely conducted through the contact 604).

Figure 7:
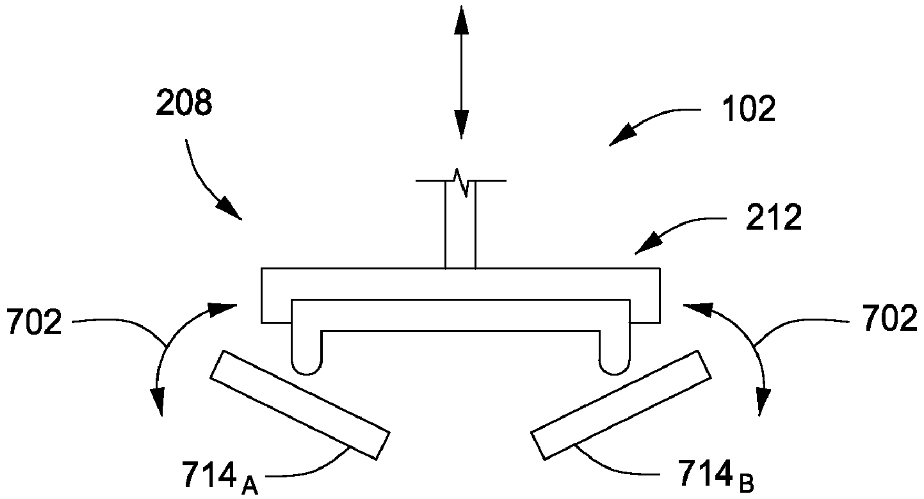
FIG. 7 depicts a schematic side view of a smart switch having a resilient contact element and contact pads configured in accordance with some embodiments of the present invention.

Although shown disposed in the beam 210, the spring 602 (or other mechanism) may be disposed in other locations as well, such as in the tip 212, in one or more of the contact pads $\mathbf{214}_{A\text{-}B}$, or the like. In some embodiments, one or more of the contact pads may be provided with a mechanism to facilitate rotation, or pivoting, of the contact pad or contact pads while maintaining relatively even contact pressure between the tip and the contact pads. For example, FIG. 7 depicts a schematic side view of a switch 102 having a resilient contact element 208 and contact pads $\mathbf{714}_{A\text{-}B}$ configured in accordance with some embodiments of the present invention. As depicted in FIG. 7, the contact pads $\mathbf{714}_{A\text{-}B}$ may be provided with a mechanism, as discussed above, that facilitates rotation of the contact pads $\mathbf{714}_{A\text{-}B}$ when a force is applied thereagainst (e.g., the contact pads $\mathbf{714}_{A\text{-}B}$ may resiliently deflect when the tip 212 presses against the contact pads $\mathbf{714}_{A\text{-}B}$). For example, when the switch 102 is in an open position (as shown) the contact pads $\mathbf{714}_{A\text{-}B}$ may be in an initial, resting position. When an actuation force greater than that required to make initial contact between the tip 212 and the contact pads $\mathbf{714}_{A\text{-}B}$, the contact pads $\mathbf{714}_{A\text{-}B}$ may flex, or rotate (as shown by arrows 702) to facilitate maintaining relatively even contact pressure between the tip 212 and the contact pads $\mathbf{714}_{A\text{-}B}$.

In some embodiments, the smart switch 100 may be configured in plane substantially parallel to a substrate upon which the smart switch 100 may be disposed. For example, each of the views shown in FIGS. 1-7 herein may be top views of the smart switch (or portions thereof) such that a substrate upon which the smart switch is disposed lies beneath the components illustrated in the various drawings. As such, the actuation of the smart switch (e.g., the movement of the actuator 114 and the switch 102, as shown in FIG. 1, the movement of the beam 210 and the tip 212, as shown in FIGS. 2A-3B and 6, and the movement of the tip 212, as shown in FIGS. 4A-5C and 7) may be in a plane substantially parallel to the page as drawn, and to the underlying substrate.

Returning to FIG. 1, the monitor 104 may be provided for monitoring a performance characteristic (or a plurality of performance characteristics) of the switch 102. The monitor 104 may include software and/or hardware elements and may be physically coupled to the switch 102 or disposed in a position suitable for monitoring the desired performance characteristics of the switch 102. The monitor 104 may monitor any performance characteristic suitable for determining whether the switch 102 is performing as desired, or if the performance of the switch 102 is degrading or failing. Non-limiting examples of suitable characteristics of switch performance include at least one of a voltage drop across the switch, a temperature of the switch, a temperature of one or more components near the switch (or an atmosphere near the switch), a signal power input to output ratio, a degradation of a signal passing through the switch, or some other performance characteristic of the switch.

In the illustrative embodiment shown in FIG. 1, an example of a monitor 104 configured to monitor a voltage drop across the switch 102 is provided. In some embodiments, the monitor 104 may include an operational amplifier (op-amp) 112 having inputs respectively coupled to an input and an output of the switch 102 (for example, coupled to conductors 118 and 120 in FIG. 1) for comparing the respective voltages proximate the input and the output of the switch and calculating a voltage drop across the switch 102. A signal corresponding to the voltage drop may then be sent from an output of the op-amp 112 to the controller 106 (for example, via a control line 108). In embodiments where other characteristics are monitored, other suitable configurations of the monitor 104 may be provided. For example, in embodiments where temperature is monitored, a thermocouple or other temperature measuring element may be utilized to provide a signal corresponding to the temperature being monitored.

The controller 106 may be any suitable controller for controlling operation of the switch 102 (as illustratively depicted by control line 110), such as a computer or computational circuit that may perform a calculation on an input signal or signals received from the monitor 104 to provide a corresponding output signal for controlling operation of the switch 102. Although shown as separate elements in FIG. 1, in some embodiments, the monitor 104 may be part of the controller 106.

The controller 106 may be part of the actuator 114 or may provide a signal to the actuator 114 that controls the movement of the switch 102. For example, in some embodiments, the contact force applied by the switch 102 may be controlled by varying an actuation voltage provided to the actuator 114 coupled to the switch 102. The controller 106 may, in response to the signal received from the monitor, vary the actuation voltage to facilitate increasing or decreasing the contact force applied by the switch 102 (without inducing or varying wipe), increasing or decreasing the contact force applied by the switch 102 to induce, increase, or lessen the amount of wipe provided by the switch 102, impose an actuation waveform on the switch 102 to cause the switch 102 to oscillate, jitter, sweep back and forth, or otherwise move while in contact with the contact pad of the output leg of the switch (for example, while contacting a terminal coupled to the conductor 120 in FIG. 1). In some embodiments, such control may be implemented during a closed cycle of the switch (e.g., without opening the switch). In some embodiments, such control may be implemented between open and closed cycles of the switch.

Thus, the controller 106 may control the operation of the switch 102 in response to the monitored characteristics provided by the monitor 104. Such control may advantageously selectively apply wipe only when needed in order to minimize wear of the switch. Such control may further advantageously modify the wipe of the switch (such as by varying the amount of wipe within or between cycles of the switch, wiping forward and then backing off without breaking contact or opening the switch, repeatedly wiping forward and back, or the like).

For example, in some embodiments, the switch may be operated with no wipe for a first period of time until the monitor detects a degradation in performance below a predefined level. The controller may then cause the switch to operate with a first quantity of wipe, for example, by stepping up the actuation voltage to a first increased level. The switch may then be again operated with the first quantity of wipe for a second period of time until the monitor again detects a degradation in performance below a predefined level. The controller may then cause the switch to operate with a second quantity of wipe, for example, by stepping up the actuation voltage to a second increased level. The switch may then be again operated with the second quantity of wipe for a third period of time until the monitor again detects a degradation in performance below a predefined level. This sequence may be repeated until some maximum wipe is reached, or until the connection between the contact pad or contact pads and the switch is improved (for example, by using any of the methods discussed herein) such that the switch may be operated at lower quantities of wipe, or with no wipe.

Such control over the switch performance may advantageously prolong switch life by removing any corrosion, particles, or other physical impediments to making desired contact when in a closed position by the wiping action of the switch, and/or by moving the final resting place of the resilient contact element of the switch (for example the tip 212 shown in FIGS. 2A-B) out of a corroded or worn portion of the contact terminal to a location capable of providing the desired signal conductance through the switch 102, and/or by rotating the tip of the resilient contact element of the switch to provide a fresh contact surface. Such control over the switch performance may further advantageously reduce power consumption utilized to operate the switch by providing only the minimum power required to provide the desired switch performance (for example, by controlling actuation voltage of the actuator controlling switch movement), and thereby may extend battery life for battery-powered devices utilizing smart switches in accordance with embodiments of the present invention. For example, such a smart switch may be actuated with a less than about 3 Volt signal, as compared to some conventional switches which, as discussed in the background section, may require about 40 Volts, or in some embodiments between about 60-70 Volts, for operation.

Figure 8:
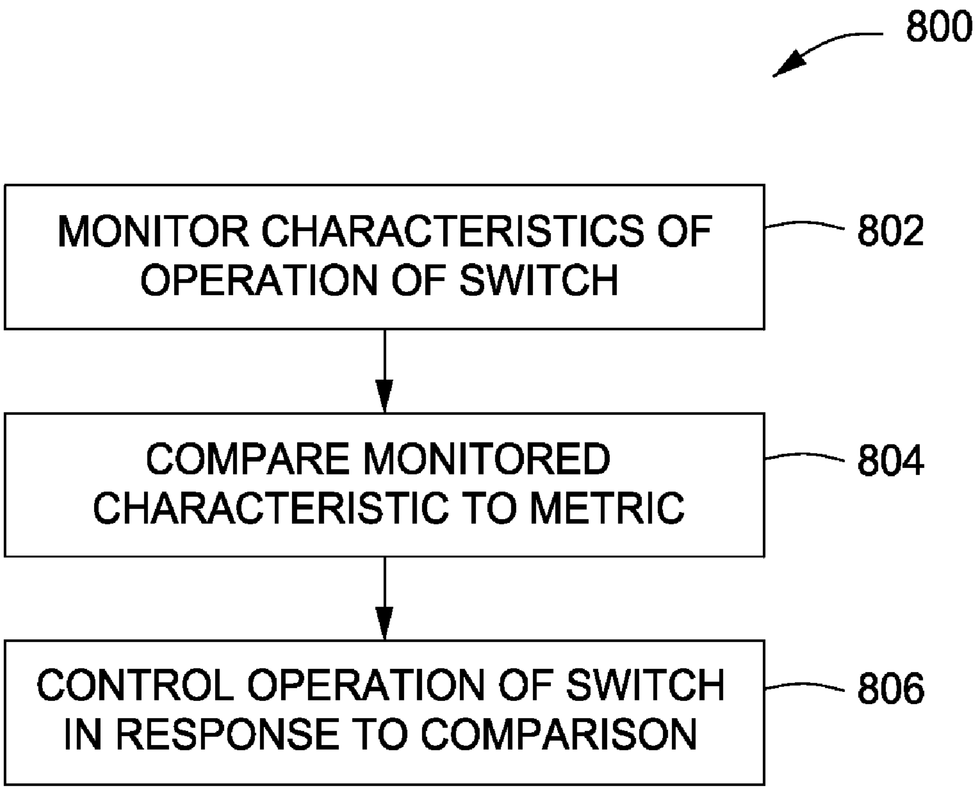
FIG. 8 depicts a flowchart of a method of using a smart switch in accordance with some embodiments of the present invention.

FIG. 8 depicts a flowchart of a process 800 for utilizing a smart switch in accordance with some embodiments of the present invention. For illustrative purposes, the process 800 will be described in conjunction with FIGS. 1, 2A, and 3A-B. Other switch embodiments as taught herein may similarly be utilized as described below with respect to FIG. 8.

In some embodiments, the process 800 may begin at 802, where characteristics of the operation of the switch 102 may be monitored. For example, the switch 102 may begin in an open position (as shown in FIG. 2A) and, upon instruction by the controller, may move to a closed position (as shown in FIG. 3A). A monitor 104 (as shown in FIG. 1) may be provided to monitor characteristics of operation of the switch 102, such as at least one of a voltage drop across the switch, a temperature of the switch, a temperature of one or more components near the switch (or an atmosphere near the switch), a signal power input to output ratio, a degradation of a signal passing through the switch, or some other performance characteristic of the switch.

Next, at 804, the monitored characteristic(s) may be compared to a metric. For example, the monitored characteristic (s) may be compared to a metric such as a baseline or range of acceptable values, and/or a statistical analysis (e.g., using statistical process control (SPC), multivariant analysis, or the like) of the monitored characteristic(s) (or a series of one or more monitored characteristics) may be performed, or the like, in order to compare the desired metric to the characteristic(s) of the present switch performance or the trend of the switch performance over time. The baseline, range of acceptable values, or statistical analysis may include modeled acceptable performance data based upon a given design and application, empirically determined performance data, or a combination of the two. Such comparison or analysis may be performed by the controller 106 upon receiving a signal representing the monitored characteristic(s) from the monitor 104.

At 806, the operation of the switch 102 may be controlled in response to the comparison at 804. For example, the monitored characteristic from 804 may lie beyond an acceptable tolerance from a desired point, or may exceed a predefined statistical variation (such as exceeding predefined limits during SPC monitoring), or the like. In response, the controller 106 may control the operation of the switch 102 to alter the performance of the switch 102 such that the monitored characteristic (and analysis thereof) is expected to indicate a return to acceptable switch performance (or actually provides acceptable switch performance when monitored).

For example, the controller 106 may increase the voltage of the signal passing through the switch 102, may increase the force applied by the actuation mechanism driving the switch 102, may introduce a wipe motion into the switch operation (as shown in FIG. 3B), may introduce a complex motion into the switch actuation (such as imparting a wipe and pullback upon actuation of the switch 102, or imparting an actuation waveform to cause the switch to oscillate or jitter on the contact pad, or the like). Upon completion of 806, the process 800 may continue at 802, where characteristics of the operation of the switch 102 may continue to be monitored.

Thus, a continuous process of monitoring, comparing, and controlling the operation of the switch may be performed. For example, in some embodiments, in response to a monitored characteristic being outside of some acceptable pre-defined range, the controller 106 may increase the force applied by the actuator 114 (such as by providing an increased, or stepped-up actuation voltage thereto) such that a first quantity of wipe is applied by the switch 102 to the contact pad 214 or contact pads $\mathbf{214}_{A\text{-}B}$. The switch 102 may continue to be operated with the first quantity of wipe (e.g., at the stepped-up actuation voltage level) for a period of time until the monitored characteristic again becomes unacceptable. The controller 106 may then cause the switch 102 to operate with a second quantity of wipe, for example, by stepping up the actuation voltage to a second increased level. The switch 102 may then be again operated with the second quantity of wipe for a period of time until monitored characteristic again becomes unacceptable, and so on. In some embodiments, In some embodiments, the controller 106 may be configured to provide a stepped change in wipe applied by the switch 102 between closing cycles thereof.

Figure 9:
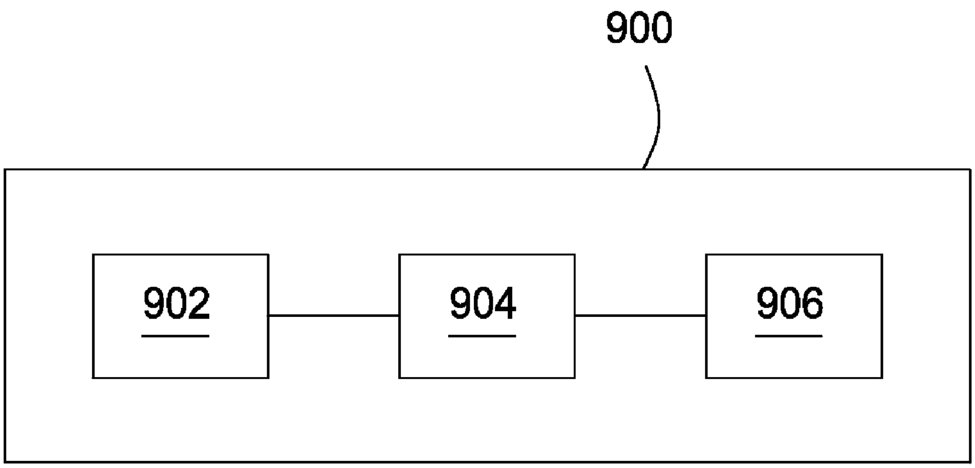
FIG. 9 depicts an electronic device having a smart switch in accordance with some embodiments of the present invention.

In some embodiments, a smart switch in accordance with the teachings provided herein may be provided in an electronic device. For example, FIG. 9 depicts an electronic device 900 having an input circuit 902 for providing a signal and an output circuit 906 for receiving the signal from the input circuit. A smart switch 904 may be provided to selectively couple the input circuit 902 to the output circuit 906 as described in more detail above.

The electronic device 900 may be any electronic device having an internal electronic switch that controls aspects of the operation thereof. Non-limiting examples of suitable electronic devices include portable and non-portable electronic devices (for example, portable phones (e.g., cell phones, smart phones, or the like), personal digital assistants, music players (e.g., radios, digital music players, or the like), digital cameras and/or video cameras, electronic games, navigational devices, computers and/or computing devices, televisions and/or video players, multimedia players, or the like), or the like. Such electronic devices may portable, non-portable, installed electronic devices (such as any of the preceding installed in a home, vehicle, or other location), or the like.

Thus, embodiments of a smart switch and electronic devices advantageously utilizing such smart switches have been provided herein. The smart switch is advantageously capable of monitoring its own health (e.g., characteristics of performance of the switch) and controlling operation of the switch in response to the health monitoring function. The smart switch may advantageously increase performance and lifetime of the switch, thereby providing a switch having a longer life and higher reliability. The smart switch may advantageously improve performance, lifetime, and/or battery lifetime in devices incorporating such smart switches.

While the foregoing is directed to embodiments of the present invention, other and further embodiments of the invention may be devised without departing from the basic scope thereof, and the scope thereof is determined by the claims that follow.

The invention claimed is:

1. A smart switch, comprising:
a switch having a wipe capability;
a monitor coupled to the switch for monitoring a performance characteristic thereof; and
a controller configured to provide a stepped change in wipe applied by the switch across a surface of a contact pad in response to the switch moving into contact with the contact pad between closing cycles of the switch in response to the monitored performance characteristic.

2. The smart switch of claim 1, wherein the monitor is configured to monitor at least one of a voltage drop across the switch, a temperature of the switch, a temperature proximate the switch, a signal power input to output ratio, or a degradation of a signal passing through the switch.

3. The smart switch of claim 1, wherein the switch is a MEMS switch.

4. The smart switch of claim 1, wherein the smart switch comprises a resilient contact element having a tip configured to wipe the contact pad with which the tip makes contact.

5. The smart switch of claim 1, wherein the monitor comprises a monitoring circuit.

6. The smart switch of claim 5, wherein the monitoring circuit is configured to measure a voltage drop across the switch.

7. The smart switch of claim 1, wherein the monitor comprises a thermocouple for measuring the temperature of the switch, or of components or atmosphere proximate the switch.

8. The smart switch of claim 1, wherein the monitor monitors the performance of the switch when the switch is in a closed position.

9. The smart switch of claim 1, wherein each of the closing cycles comprises the switch being brought into and then out of contact with the contact pad.

10. An electronic device, comprising:
an input circuit for providing a signal;
an output circuit for receiving the signal from the input circuit; and
a smart switch for selectively coupling the input circuit to the output circuit, the smart switch comprising:
a switch having a wipe capability;
a monitor coupled to the switch for monitoring a performance characteristic thereof; and
a controller configured to provide a stepped change in wipe applied by the switch across a surface of a contact pad in response to the switch moving into contact with the contact pad between closing cycles of the switch in response to the monitored performance characteristic.

11. The electronic device of claim 10, wherein the electronic device comprises a portable phone, a cell phone, a smart phone, a personal digital assistant, a music player, a radio, a digital music player, a digital camera, a video camera, an electronic game, a navigational device, a computer, a computing device, a television, a video player, or a multimedia player.

12. The electronic device of claim 10, wherein each of the closing cycles comprises the switch being brought into and then out of contact with the contact pad.

13. A method of switching a signal in a microelectronic device, comprising:
monitoring one or more characteristics of operation of a switch;
comparing the monitored characteristics to a metric; and
between closing cycles of the switch, changing, in response to the comparison, a quantity of wipe applied by the switch across a surface of a contact pad in response to the switch moving into contact with the pad.

14. The method of claim 13 further comprises:
adjusting a contact force applied by the switch.

15. The method of claim 13 further comprises:
causing a contact element of the switch to wipe the contact pad by a fixed quantity.

16. The method of claim 15, wherein wiping the contact pad by a fixed quantity further comprises:
causing a contact element of the switch to wipe the contact pad by a first quantity greater than the fixed quantity; and
causing the contact element to reduce the wipe of the contact pad by a second quantity to result in the fixed quantity of wipe.

17. The method of claim 13 further comprises:
causing a contact element of the switch to increase the wipe of the contact pad between closed cycles of the switch.

18. The method of claim 13 further comprises:
adjusting an actuation voltage applied to the switch.

19. The method of claim 18, wherein the actuation voltage is less than about 3 Volts.

20. The method of claim 13 further comprises:

controlling an actuation mechanism that operates the switch.

21. The method of claim 13, wherein monitoring one or more characteristics of operation of the switch further comprises:

monitoring at least one of a voltage drop across the switch, a temperature of the switch, a temperature proximate the switch, a signal power input to output ratio, or a degradation of a signal passing through the switch.

22. The method of claim 13, wherein each of the closing cycles comprises the switch being brought into and then out of contact with the contact pad.

* * * * *